(12) United States Patent
Paun

(10) Patent No.: US 6,943,749 B2
(45) Date of Patent: Sep. 13, 2005

(54) PRINTED CIRCUIT BOARD DIPOLE ANTENNA STRUCTURE WITH IMPEDANCE MATCHING TRACE

(75) Inventor: Cristian Paun, Goleta, CA (US)

(73) Assignee: M&FC Holding, LLC, Wilmington, DE (US)

(*) Notice: Subject to any disclaimer, the term of this patent is extended or adjusted under 35 U.S.C. 154(b) by 55 days.

(21) Appl. No.: 10/759,259

(22) Filed: Jan. 19, 2004

(65) Prior Publication Data

US 2004/0150565 A1 Aug. 5, 2004

Related U.S. Application Data

(60) Provisional application No. 60/444,086, filed on Jan. 31, 2003.

(51) Int. Cl.[7] ................................................ H01Q 9/28
(52) U.S. Cl. .............................. 343/795; 343/700 MS
(58) Field of Search .......................... 343/700 MS, 793, 343/795, 803, 846

(56) References Cited

U.S. PATENT DOCUMENTS

| | | | |
|---|---|---|---|
| 4,381,566 A | 4/1983 | Kane | 455/193 |
| 4,782,345 A | 11/1988 | Landt | 343/727 |
| 5,495,260 A | 2/1996 | Couture | 343/795 |
| 5,657,028 A | 8/1997 | Sanad | 343/700 |
| 5,709,832 A | 1/1998 | Hayes et al. | 264/272.11 |
| 5,841,401 A | 11/1998 | Bodley et al. | 343/700 |
| 5,844,525 A | 12/1998 | Hayes et al. | 343/702 |
| 5,914,695 A | 6/1999 | Liu et al. | 250/559.45 |
| 5,945,954 A | 8/1999 | Johnson | 343/702 |
| 5,949,385 A | 9/1999 | Asakura et al. | 343/895 |
| 5,999,140 A | 12/1999 | Johnson | 343/795 |
| 6,008,774 A | 12/1999 | Wu | 343/828 |
| 6,031,491 A | 2/2000 | Daniel et al. | 343/700 |
| 6,046,703 A | 4/2000 | Wang et al. | 343/795 |
| 6,067,052 A | 5/2000 | Rawles et al. | 343/741 |
| 6,111,549 A | 8/2000 | Feller | 343/795 |
| 6,239,764 B1 * | 5/2001 | Timofeev et al. | 343/795 |
| 6,353,443 B1 | 3/2002 | Ying | 345/702 |
| 6,366,259 B1 | 4/2002 | Pruett et al. | 343/853 |
| 6,396,456 B1 | 5/2002 | Chiang et al. | 343/795 |
| 6,753,814 B2 * | 6/2004 | Killen et al. | 343/700 MS |

FOREIGN PATENT DOCUMENTS

EP        0 274 592        7/1988

* cited by examiner

Primary Examiner—Shih-Chao Chen
(74) Attorney, Agent, or Firm—Andrus, Sceales, Starke & Sawall, LLP

(57) ABSTRACT

A printed circuit board antenna structure for the transmission of radio frequency energy. The printed circuit board antenna of the present invention includes a circuit board subassembly having a component mounting section and an antenna section. The antenna section of the circuit board includes a pair of antenna traces that function as two sides of a dipole antenna. Each antenna trace includes a radiating strip where the combination of the pair of radiating strips has a length less than one-half the wavelength of the desired radiation being transmitted. Each antenna trace includes an impedance matching strip having a serpentine structure and coupled to the radiating strip. The impedance matching strip matches the desired impedance for the antenna driving circuit.

19 Claims, 7 Drawing Sheets

PRINTED CIRCUIT BOARD DIPOLE ANTENNA STRUCTURE WITH IMPEDANCE MATCHING TRACE

CROSS-REFERENCE TO RELATED APPLICATIONS

The present application is based on and claims priority to U.S. Provisional Patent Application No. 60/444,086 filed on Jan. 31, 2003.

FIELD OF THE INVENTION

The present invention generally relates to the field of antennas for transmitting radio frequency signals. More particularly, the present invention relates to a printed antenna comprised of thin layers of electrically conductive material that are bonded onto a thin, planar dielectric material such as a printed circuit board (PCB) that also serves as a platform for an antenna driving circuit.

BACKGROUND OF THE INVENTION

Presently, the desire for antennas for transmitting radio frequency signals from a small, compact location to an external receiver has grown significantly. For example, antennas for transmitting radio frequency signals from a recording or monitoring device, such as a thermostat, water meter, gas meter, electric meter or any similar type of device to a remote location that is configured to monitor and record the status of the device have become increasingly desirable. Since many of the devices utilizing an RF antenna are produced in very large quantities, a desire and need exists for an antenna that can transmit the RF signals a desired distance while being low in cost to produce and assemble.

Typically, an antenna structure is formed separate from the printed circuit board that includes the antenna driving circuit. The separate antenna device increases the cost to produce the combination of the antenna and driving circuit while also increasing the size of the compartment needed to house the two separate components.

In an effort to avoid the use of external antennas, manufacturers have utilized micro strip patch antennas, the characteristics of which are well known. Briefly, a micro strip patch antenna includes a dielectric material, such as a printed circuit board, which has two opposed surfaces. One of the surfaces is coated with an electrically conductive layer that functions as a ground plane and the opposed surface has an essentially rectangular or circular shaped electrically conductive layer (micro strip patch) disposed to extend over the ground plane. The micro strip patch antenna presents a thin resonating cavity where standing electromagnetic waves can exist and can be radiated from the edges of the antenna.

Micro strip patch antennas, however, have many limitations, including the ability to radiate only above the ground plane. Further, because the micro strip patch antenna has a resonant cavity that greatly depends upon the thickness of the dielectric material utilized, tuning such an antenna is difficult. Thus, the printed circuit board forms a important part of the antenna structure, even though a PCB is typically formulated with rather low tolerances.

Therefore, it is an object of the present invention to provide a printed antenna that can be formed directly on a dielectric material, such as a printed circuit board, that also is used to mount the antenna driving circuitry. Further, the present invention seeks to provide a printed circuit antenna that functions as a dipole antenna having a radiating portion significantly less than one-half the wave length of the received/transmitted frequency range. The antenna also provides an impedance matching strip that allow the antenna to match the impedance of the antenna driving circuit by increasing or decreasing the length and configuration of the impedance matching strip.

SUMMARY OF THE INVENTION

The present invention is a printed antenna for the transmission of electromagnetic waves, such as radio frequency signals, from an electrical device coupled to the printed antenna. The printed antenna of the present invention is designed for use in communicating information from a measurement device, such as an electronic thermostat, gas meter, water meter, electric meter or similar device. However, the printed antenna of the present invention can be utilized for transmitting information from any device that incorporates an antenna driving circuit mounted to a printed circuit board.

The printed antenna of the present invention includes a substantially planar printed circuit board that is formed from a dielectric material. The printed circuit board is a conventional component and is utilized to mount an antenna driving circuit that operates to generate electromagnetic waves for transmission and receives electromagnetic information from a remote transmission device. The circuit board includes a planar first surface and a planar second surface that are separated by a material thickness.

The circuit board is a unitary structure and is configured to include both a mounting section and an antenna section. The mounting section of the circuit board includes the antenna driving circuit for the printed antenna. Specifically, the antenna driving circuit is mounted to the first surface of the circuit board within the mounting section.

The second planar surface of the mounting section of the circuit board includes a coating of electrically conductive material that covers substantially all of the mounting section. Thus, the coating of electrically conductive material that defines the ground plane is positioned on the opposite side of the circuit board from the antenna driving circuit such that the antenna driving circuit is positioned opposite the area defined by the ground plane.

The antenna section of the circuit board includes both a first antenna trace and a second antenna trace that form opposite halves of a one-half wavelength dipole antenna. Each of the antenna traces is formed from an electrically conductive material printed onto the face surface of the circuit board.

Each antenna trace includes a connecting strip that couples the antenna trace to either ground or the active connection of the antenna driving circuit. Since the antenna traces are a mirror images of the opposite antenna trace, the configuration of each antenna trace is identical.

Each antenna trace includes a radiating strip extending from the connection strip. The combined length of the two radiating strips is less than one-half the wavelength of the desired frequency that the antenna structure radiates and receives.

As such, each antenna trace also includes an impedance matching strip coupled to the radiating strip. The impedance matching strip is a serpentine structure and is coupled to the radiating strip by a connecting trace. The connecting trace forms a connection between the radiating strip and the impedance matching strip and is configured depending upon the overall shape of the printed circuit board. The impedance matching strip is joined to the radiating strip to define a continuous length of electrically conductive material applied to the front face surface of the antenna section. The impedance matching strip is coupled to the radiating strip and has a length such that the impedance matching strip functions to match the impedance of the antenna driving circuit.

In the preferred embodiment of the invention, the impedance matching strip includes a plurality of parallel legs joined to each other and coupled to the radiating strip. Each leg of the impedance matching strip is parallel to the radiating strip. The legs of the impedance matching strip are joined to each other by connector portions such that the entire impedance matching strip is a continuous trace applied to the face surface of the antenna section.

In a preferred embodiment of the invention, one of the legs of the impedance matching strip is shorter than the remaining legs such that the leg acts as a tuning stub. The length and characteristics of the tuning stub can be adjusted to fine tune the impedance matching strip to the impedance requirement of the antenna driving circuit.

Various other features, objects and advantages of the invention will be made apparent from the following description taken together with the drawings.

BRIEF DESCRIPTION OF THE DRAWINGS

The drawings illustrate the best mode presently contemplated of carrying out the invention.

In the drawings.

DETAILED DESCRIPTION OF PREFERRED EMBODIMENTS

Figure 1:
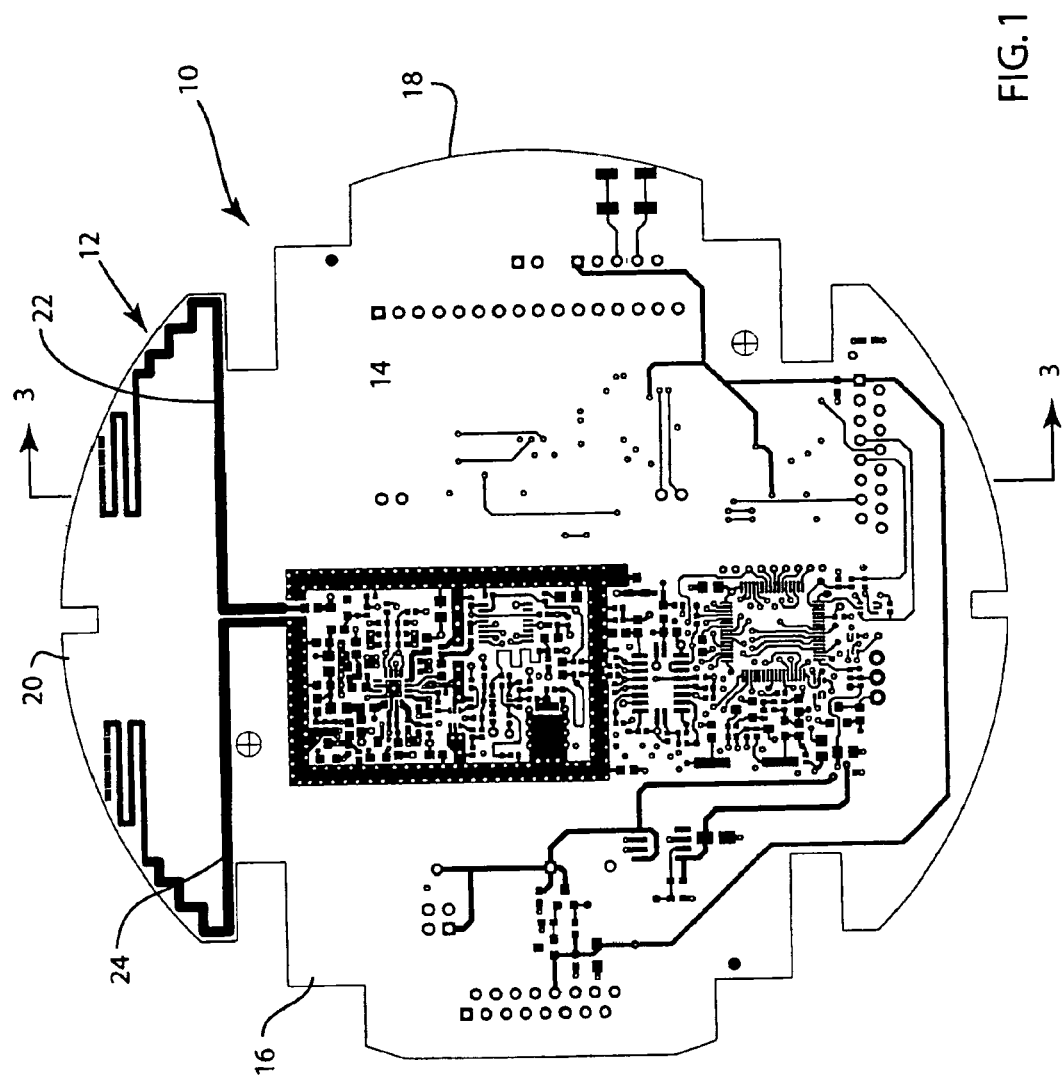
FIG. 1 is a front plan view of a printed circuit board including the printed dipole antenna of the present invention.

Referring first to FIG. 1, thereshown is a printed circuit board 10 including both a printed circuit board dipole antenna structure 12 and an antenna driving circuit 14. The antenna driving circuit 14 includes various electronic components for driving and receiving signals from the printed dipole antenna structure 12 of the present invention. The antenna driving circuit 14 both applies and receives radio frequency energy from the printed dipole antenna 12. The antenna driving circuit 14 is mounted to the first, front surface of the circuit board 16 in a known manner, such as by automated surface mount technology techniques. The antenna driving circuit 14 is a conventional configuration and is well known to those skilled in the art. Many different configurations for the antenna driving circuit 14 are contemplated as being within the scope of the present invention. The specific configuration of the antenna driving circuit 14 is not shown, since the specific configuration of the antenna driving circuit 14 does not form part of the present invention.

As can be seen in FIG. 1, the circuit board 16 has a generally circular configuration, since the circuit board 16 shown in the preferred embodiment of the invention is for use within an electric meter. However, it should be understood that the physical configuration of the circuit board 16 depends upon its operating environment and thus can vary depending upon the specific application.

As illustrated in FIG. 1, the printed circuit board 10 includes both a component mounting section 18 and an antenna section 20. The component mounting section 18 and the antenna section 20 are integrally formed with each other and form the unitary printed circuit board 10. In the preferred embodiment of the invention shown in FIG. 3, a layer of conductive coating 21 is applied to the second, back face surface of the component mounting section 18 to provide a ground plane for the antenna driving circuit 14 mounted to the front face surface of the circuit board within the component mounting section 18. Preferably, the coating of electrically conductive material is an applied copper coating that defines the ground plane for the printed circuit board 10. Although copper is used in the present invention, other conductive coatings, such as gold, silver, etc., are contemplated as being within the scope of the present invention.

The ground plane formed by the layer of electrically conductive material 21 is positioned beneath only the component mounting section 18 and is not applied to the back surface of the printed circuit board beneath the antenna section 20.

As illustrated in FIG. 1, the antenna section 20 includes a first antenna trace 22 and a second antenna trace 24. The first and second antenna traces 22, 24 function as both sides of a one-half wavelength dipole antenna for transmitting electromagnetic waves generated by the antenna driving circuit 14 and for receiving electromagnetic waves and transferring the received signals to the antenna driving circuit 14.

In the preferred embodiment of the invention, the dipole antenna structure 12 is configured to transmit signals in the range of 900 MHz–960 MHz. As such, the antenna 12 is driven by a circuit that requires an impedance of approximately 50 ohms. Therefore, an impedance matching circuit that offsets the antenna impedance as close to 50 ohms is desired. The proper impedance matching facilitates proper operation of the system, in both the receive and transmit modes.

Figure 2:
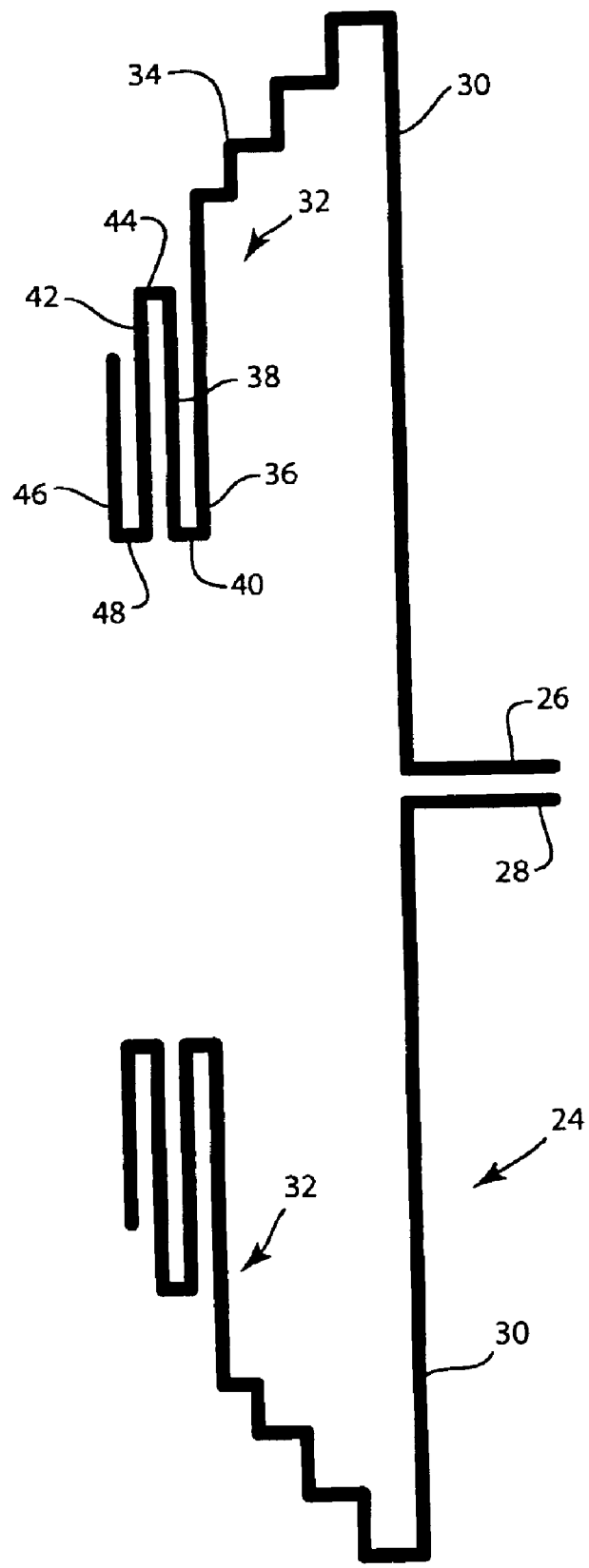
FIG. 2 is a detailed illustration of the printed dipole antenna including an impedance matching strip.

Referring now to FIG. 2, thereshown are the details of the first antenna trace 22 and the second antenna trace 24. In the following description, the dimensions for the various components of the antenna traces 22 and 24 are set forth. However, it should be understood that the actual dimensions for the traces 22 and 24 will vary depending on the size of the circuit board and the transmission and receiving frequency of the antenna. As illustrated, the first and second antenna traces 22, 24 are mirror images of each other such that both sides of the dipole antenna are matched. The first antenna trace 22 includes a connection strip 26 that connects the first antenna trace 22 to the ground plane for the antenna driving circuit. The second antenna trace 24 includes a similar connecting strip 28 that couples the second antenna trace 24 to the active driving components of the antenna driving circuit 14. Both the first and second connecting strips 26, 28 are parallel to each other, as illustrated.

Each of the connecting strips 26, 28 are electrically coupled to a radiating strip 30. As illustrated in FIG. 2, the radiating strips 30 extend in opposite directions and each have a length of 1.564 inches, such that the combination of the two radiating strips 30 has a combined length of 3.128 inches. Since the antenna structure of the present invention functions as a one-half wavelength dipole antenna, the required length of the antenna is approximately 6.5 inches for the optimal radiation of signals having a center frequency of 930 MHz. Since the circuit board 16 shown in FIG. 1 must fit within the housing of a conventional electric meter, the length of the radiating strips 30 are limited by the physical configuration of the antenna enclosure.

To compensate for the reduced length of the radiating strips 30, each of the first and second antenna traces 22, 24 includes an impedance matching strip 32. The impedance matching strip of the first antenna trace 22 and the second antenna trace 24 are identical to each other such that each side of the dipole antenna structure is matched to the opposite side of the antenna structure.

As shown in FIG. 2, the impedance matching strip 32 is electrically coupled to the radiating strip 30 by a connecting trace 34. In the embodiment of the invention illustrated in FIGS. 1 and 2, the connecting trace 34 has a stair-like pattern. This stair-like pattern is dictated by the physical configuration of the circuit board 16 onto which it is printed and forms no part of the present invention. The connecting trace 34 is a simple electrical connection between the radiating strip 30 and the impedance matching strip 32. It is contemplated by the inventors that the physical configuration of the connection trace 34 could be varied or even eliminated depending upon the physical configuration of the circuit board 16 and the space availability on the antenna section 20.

Referring back to FIG. 2, the impedance matching strip 32 in the preferred embodiment of the invention has a generally serpentine configuration and has an overall length selected to match the approximately 50 ohm impedance of the antenna driving circuit 14, as previously discussed. The impedance matching strip 32 includes a first leg 36 that is parallel to the radiating strip 30 and spaced from the radiating strip 30. In the preferred embodiment of the invention illustrated in FIG. 2, the first leg 36 has a length of 0.7 inches and is spaced from the radiating strip by 0.411 inches.

The impedance matching strip 32 further includes a second leg 38 joined to the first leg 36 by a connecting section 40. The second leg 38 is parallel to the first leg 36 and has a length less than the length of the first leg 36. In the preferred embodiment of the invention illustrated in FIG. 2, the second leg 38 has a length of approximately 0.505 inches.

The second leg 38 is joined to a third leg 42 by a second connecting portion 44. The third leg 42 has the same overall length as the second leg 38. As illustrated in FIG. 2, the first leg 36, the second leg 38 and the third leg 42 are all parallel to each other and parallel to the radiating strip 30. The combination of the parallel legs and connection sections function as an impedance matching circuit for the antenna driving circuit.

The impedance matching strip 32 further includes a tuning stub 46 connected to the third leg 42 by a connecting portion 48. The tuning stub 46 has a length of 0.367 inches, which is less than the length of the third leg 42. The length of the tuning stub 46 can be modified to fine tune the impedance matching characteristics of the impedance matching strip 32 to the specific antenna driving circuit to provide a more accurate and specific impedance matching. The length of the tuning stub 46 can be easily and readily modified during construction of the printed circuit antenna 10 without requiring a redesign of the entire impedance matching strip 32.

Figure 3:
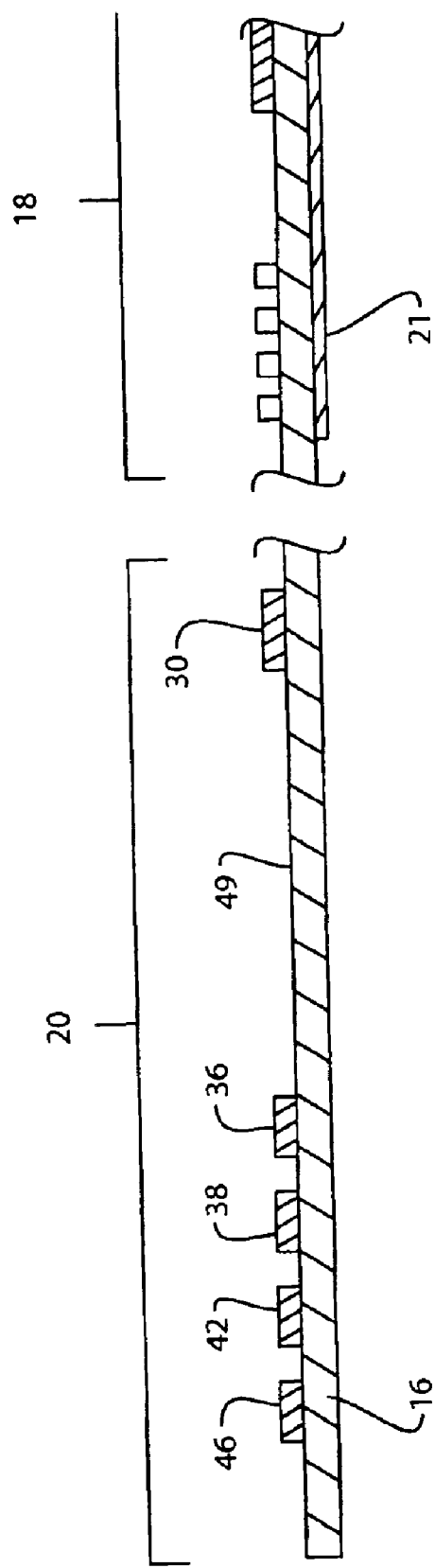
FIG. 3 is a section view taken along line 3—3 of FIG. 1.

In the preferred embodiment of the invention, the first antenna trace 22 and the second antenna trace 24, which include the pair of connecting strips 26, 28, the pair of radiating strips 30 and the pair of impedance matching strips 32 are all comprised of a layer of electrically conductive material, such as copper, disposed on the front face surface 49 of the circuit board 16, as shown in FIG. 3. Specifically, the traces are applied to the antenna section 20 of the circuit board. The copper material used to form the pair of antenna traces 22 and 24 include a protective outer coating, as is conventional.

Figure 4:
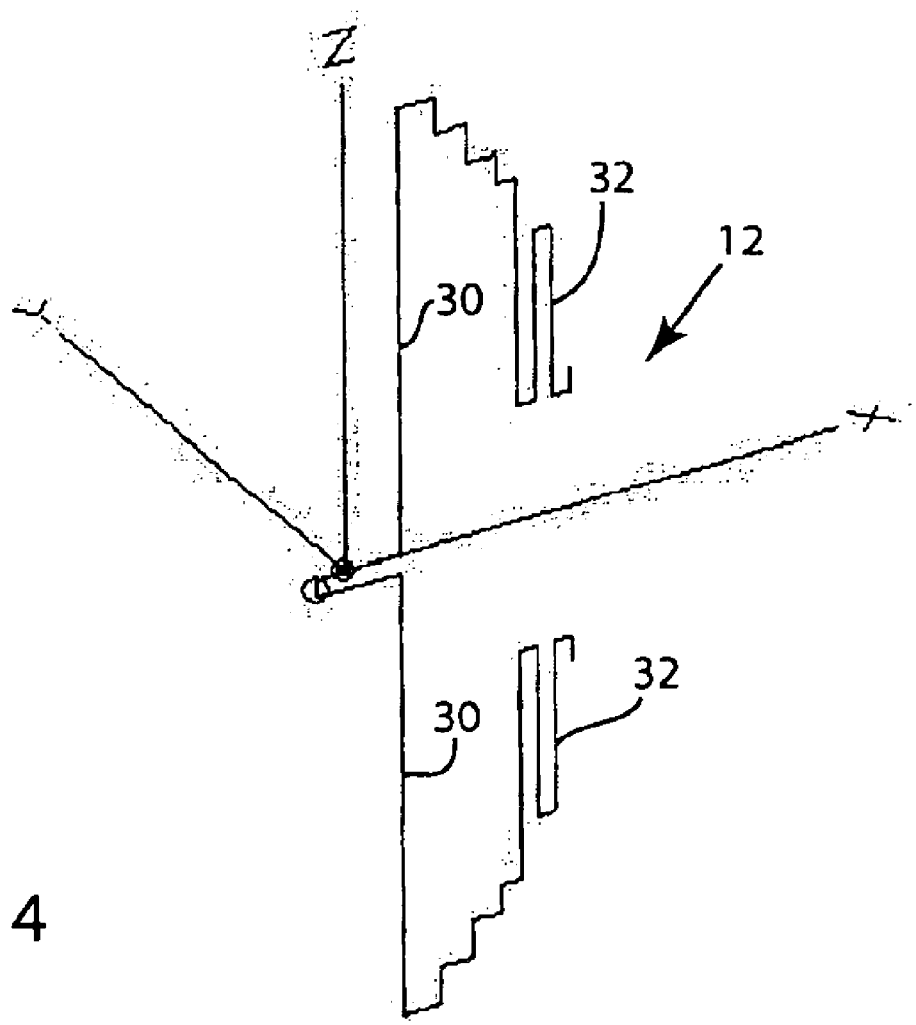
FIG. 4 is a perspective illustration showing the axes of rotation of the printed circuit board dipole antenna structure during radiation testing.

Referring now to FIG. 4, thereshown is the dipole antenna structure 12 as positioned along an X-Y-Z coordinate system. The X-Y-Z coordinate system shown in FIG. 3 will be used as a reference for the radiating results to be described as follows.

Figure 5:
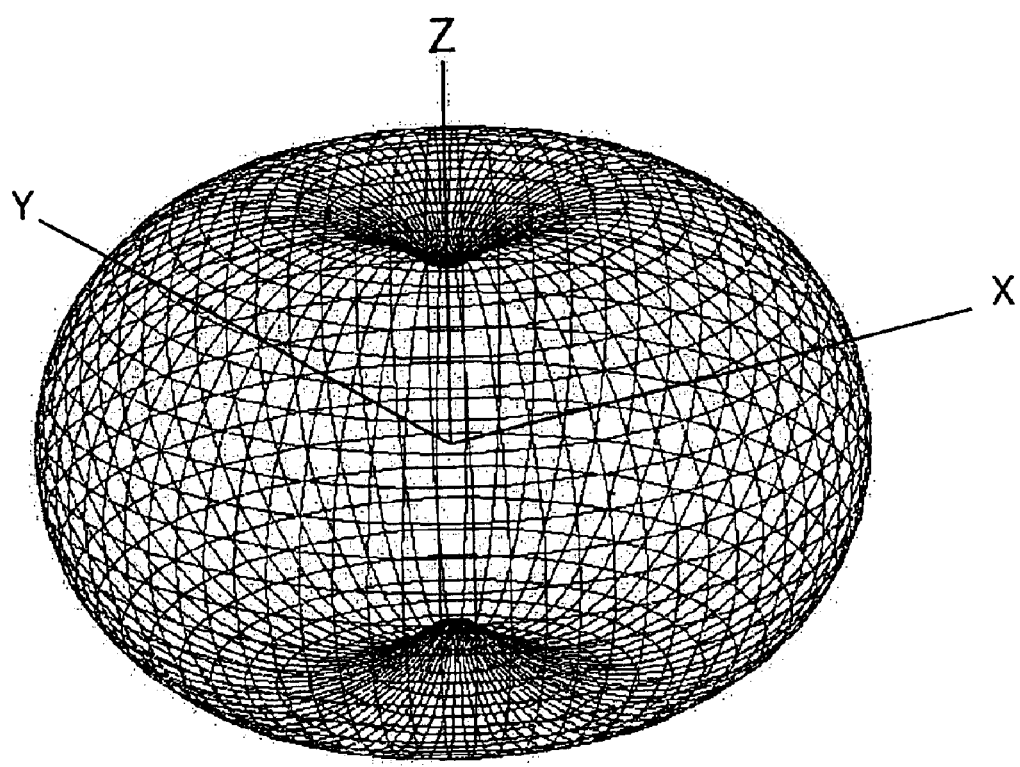
FIG. 5 is a 3-D radiation pattern for the printed circuit board dipole antenna structure of the present invention.

Referring first to FIG. 5, thereshown is the radiation pattern of the antenna of the present invention along the X, Y and Z axes. As illustrated in FIG. 5, the printed circuit board antenna 10 of the present invention exhibits a uniform radiation pattern both above and below the antenna.

Figure 6:
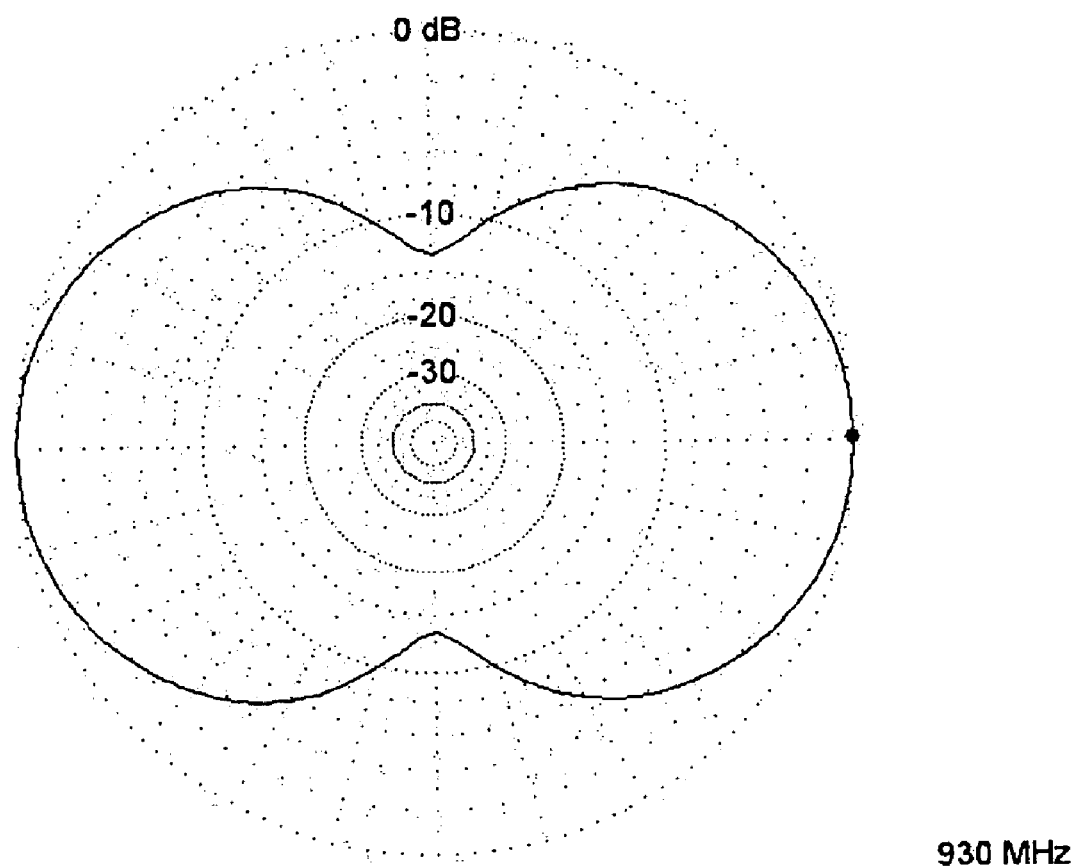
FIG. 6 is a graphic illustration of the radiation pattern of the antenna of the present invention as rotated along the Z axis.

FIG. 6 illustrates the radiation pattern when the antenna 12 is rotated 360° about the Z axis when oriented as illustrated in FIG. 4.

Figure 7:
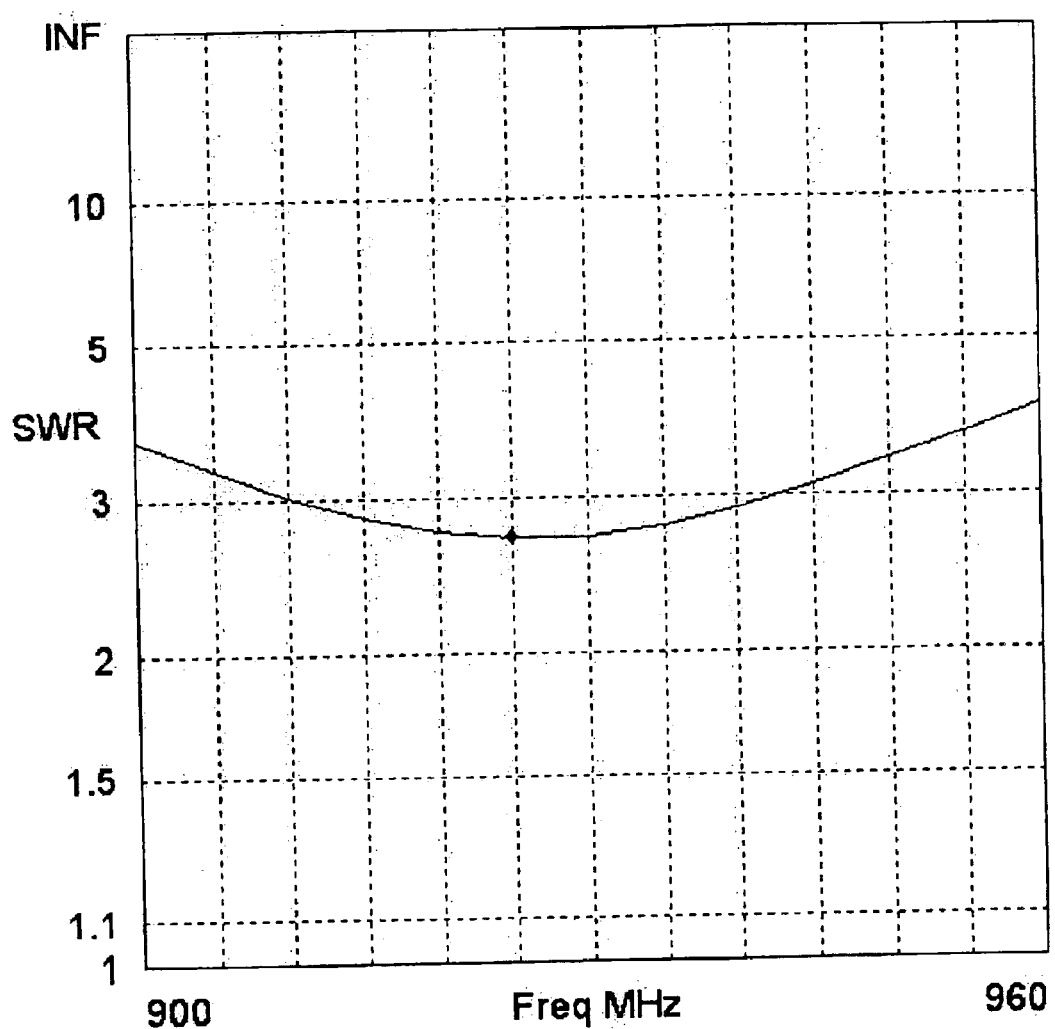
FIG. 7 is a graph illustration illustrating the SWR over a frequency range of 900 MHz to 960 MHz.

FIG. 7 illustrates the predicted standing wave ratio (SWR) for a frequency range between 900 MHz and 960 MHz. As illustrated, the SWR drops from approximately 3.8 at 900 MHz to a low value around 930 M Hz and again increases to a value of approximately 4 as the frequency rises to 960 MHz. The antenna of the present invention is intended to be used from approximately 900 MHz to approximately 960 MHz.

While the preferred embodiment of the printed antenna of the present invention has been described with certain particularly for the purposes of illustration, it should be noted that various modifications may be made while keeping within the spirit of the present invention. For example, while the specific length and configuration of the impedance matching strips 32 are shown in the Figures, it should be understood that the impedance matching strip could be configured in different manners to provide the required impedance matching for the antenna driving circuit. Additionally, although specific dimensions and shapes are shown for the circuit board, it should be understood that different circuit board sizes and shapes could be utilized. When such different sized circuit boards are utilized, the configuration of the impedance matching strip, and the connecting strip, would vary. Additionally, although the present invention is described as being particularly desirable in transmitting RF signals from commodity measuring devices, such as an electric meter, gas meter, or water meter, it should be understood that the printed circuit board antenna of the present invention could be utilized in many other operating environments while operating within the scope of the present invention.

Various alternatives and embodiments are contemplated as being within the scope of the following claims particularly pointing out and distinctly claiming the subject matter regarded as the invention.

I claim:

1. A printed antenna assembly for the transmission of electromagnetic waves, the printed antenna comprising:

a substantially planar circuit board having a first planar surface and a second planar surface, the first and second planar surfaces being parallel and spaced by a material thickness, the circuit board including a mounting section and an antenna section integrally formed with each other;

an antenna driving circuit mounted to the first surface of the mounting section for generating electromagnetic waves to be transmitted by the printed antenna;

a pair of radiating strips formed on the antenna section of the circuit board and coupled to the antenna driving circuit for the transmission of electromagnetic waves; and a pair of impedance matching strips formed on the antenna section of the circuit board and each coupled to one of the radiating strips, the impedance matching strips each having a length selected to substantially match the impedance of the antenna driving circuit.

2. The printed antenna assembly of claim 1 wherein the impedance matching strip and the radiation strip are formed on the same side of the printed circuit board.

3. The printed antenna assembly of claim 2 wherein the pair of radiation strips have a combined length less than one-half the wavelength of the transmitted electromagnetic waves.

4. The printed antenna assembly of claim 3 wherein each impedance matching strip includes at least a first leg formed on the antenna section and extending parallel to the radiation strip.

5. The printed antenna assembly of claim 4 wherein each impedance matching strip includes a second leg coupled to the first leg and extending parallel to the first leg.

6. The printed antenna assembly of claim 5 wherein the second leg is shorter than the first leg.

7. The printed antenna assembly of claim 4 wherein the impedance matching strip includes a plurality of legs each extending parallel to the radiating strip, wherein the plurality of legs are coupled to each other and spaced from each other to define a serpentine pattern.

8. The printed antenna assembly of claim 2 wherein the impedance matching strip and the radiating strip are integrally formed with each other and are formed from electrically conductive material applied to the second surface of the antenna section.

9. The printed antenna assembly of claim 7 wherein the impedance matching strip includes a tuning stub connected to the plurality of legs and extending parallel to the radiating strip, wherein the length of the tuning stub is adjustable to match the impedance of the antenna driving circuit.

10. The printed antenna assembly of claim 1 further comprising a ground plane formed on the second planar surface of the circuit board, wherein the ground plane is formed only along the mounting section of the circuit board.

11. The printed antenna assembly of claim 10 wherein the antenna driving circuit and the pair of radiating strips are both mounted to the first surface of the circuit board.

12. A printed antenna for the transmission of electromagnetic waves, the printed antenna comprising:

a substantially planar circuit board formed from a dielectric material and having a first planar surface and a second planar surface, the first and second planar surfaces being parallel and spaced by a material thickness;

a mounting section contained on the circuit board;

an antenna section contained on the circuit board and integrally formed with the mounting section; and a pair of opposed radiating and impedance matching traces formed on the first planar surface of the antenna section of the circuit board, the radiating and impedance matching traces each including a radiating strip and an impedance matching strip coupled to the radiating strip, the impedance matching strip having at least a first leg positioned parallel to the radiating strip.

13. The printed antenna assembly of claim 12 wherein the impedance matching strip includes at least a second leg coupled to the first leg and extending parallel to the first leg.

14. The printed antenna assembly of claim 13 wherein the second leg is shorter than the first leg.

15. The printed antenna assembly of claim 12 wherein the impedance matching strip includes a plurality of legs each extending parallel to the radiating strip, wherein the plurality of legs are coupled to each other and spaced from each other to define a serpentine pattern.

16. The printed antenna assembly of claim 12 further comprising an antenna driving circuit mounted to the first surface of the mounting section for generating electromagnetic waves to be transmitted by the printed antenna.

17. The printed antenna assembly of claim 16 further comprising a ground plane formed on the second planar surface of the mounting section such that the antenna driving circuit is mounted above the ground plane.

18. The printed antenna assembly of claim 15 wherein the impedance matching strip includes a tuning stub coupled to the plurality of legs and extending parallel to the radiating strip, wherein the length of the tuning stub is adjustable to match the impedance of the driving circuit.

19. The printed antenna assembly of claim 12 wherein the pair of radiating strips have a combined length less than one-half the wavelength of the transmitted electromagnetic waves.

* * * * *